United States Patent [19]
Takahashi

[11] 3,840,275
[45] Oct. 8, 1974

[54] SWITCHING CIRCUIT UTILIZING GATE CONTROLLED SWITCHING DEVICE

[75] Inventor: Shigenori Takahashi, Kanagawa-ken, Japan

[73] Assignee: Sony Corporation, Tokyo, Japan

[22] Filed: July 19, 1973

[21] Appl. No.: 380,881

[30] Foreign Application Priority Data

Oct. 6, 1972 Japan ............................. 47-116163

[52] U.S. Cl. ...... 307/252 C, 307/252 J, 307/252 K, 307/252 L, 307/254

[51] Int. Cl. ...................... H03k 17/00, H03k 17/60

[58] Field of Search ....... 307/252 C, 252 M, 252 H, 307/252 L, 252 O, 252 J, 252 K, 252 L

[56] References Cited

UNITED STATES PATENTS

| | | | |
|---|---|---|---|
| 3,114,882 | 12/1963 | Hofstein | 307/252 C |
| 3,348,073 | 10/1967 | Oudard | 307/252 C |
| 3,424,972 | 1/1969 | Ekstrom et al. | 307/252 C |
| 3,470,455 | 9/1969 | Korda | 307/252 M |
| 3,622,806 | 11/1971 | Williams | 307/252 C |

*Primary Examiner*—Rudolph V. Rolinec
*Assistant Examiner*—B. P. Davis
*Attorney, Agent, or Firm*—Lewis H. Eslinger, Esq.; Alvin Sinderbrand, Esq.

[57] ABSTRACT

A switching circuit utilizing a gate controlled switching device (GCS) or thyristor of the gate turn-off type has its gate connected to a diode having its polarity arranged to conduct a current flowing thereto from the gate which is also connected to one end of an inductive element, and the conductivity of the diode is controlled in response to a control signal so that a turn-off gate current for the GCS flows through the diode when the latter is conductive, at which time energy is stored in the inductive element, and a turn-on gate current is supplied to the GCS from the inductive element when the diode is non-conductive by reason of the energy previously stored in the inductive element.

6 Claims, 9 Drawing Figures

SWITCHING CIRCUIT UTILIZING GATE CONTROLLED SWITCHING DEVICE

BACKGROUND OF THE INVENTION

1. FIELD OF THE INVENTION

This invention relates generally to a switching circuit using a semiconductor switching device, and more particularly is directed to an improved switching control circuit for a gate controlled switching device which causes the latter to be conductive and nonconductive in accordance with a control signal.

2. DESCRIPTION OF THE PRIOR ART

In the field of switching circuits utilizing a semiconductor switching device, it has been proposed to employ a thyristor, for example, of the gate turn-off type, which is a semiconductor device also known as a gate-controlled switching device (hereinafter referred to as a GCS). In semiconductor switching circuits used as solid-state horizontal deflection circuits of television receivers or the like and in which the switching element is required to withstand a high voltage and must be capable of carrying a substantially large current, it has been considered to be preferable to utilize a GCS as the switching element due to its avoidance of several disadvantages occurring when other semiconductor switching devices, for example, transistors, are employed.

A GCS or thyristor of the gate-turn-off type is composed of four semiconductor layers, for example, first and second P-type regions and first and second N-type regions, with the first P-type region being an anode, the second N-type region being a cathode, and the second P-type region being a gate. In such a GCS, a gate current is made to flow from the gate to the cathode, and from the cathode to the gate to control the conductivity between the anode and cathode, and the change in such conductivity effects the desired switching actions.

In general, the GCS is desirable in that it is easily designed to withstand a high voltage between its anode and cathode and to carry a large current through its anode and cathode as compared with transistors or other semiconductor switching devices. Further, once the switch effect between the anode and cathode has been turned ON or OFF by the gate current between the gate and cathode, it remains in the ON or OFF state even though the gate current is not continuously applied to the GCS. Accordingly, the GCS is capable of being switched with decreased power dissipation in the gate current applying circuit, and is also capable of switching a relatively large current. However, since turning OFF of the GCS requires a relatively large amplitude gate current flowing from its cathode to its gate at the initiation of the turn-off period as compared with the amplitude of the gate current flowing from its gate to its cathode which is sufficient for turning ON the GCS, existing switching circuits employing a GCS as the switching element include a capacitor and resistor in a parallel circuit between the source of a switching control signal and the gate of the GCS for reforming the switching control signal and thereby providing the requisite large amplitude gate current for turning OFF the GCS. This parallel circuit is disadvantageous in that there is a loss of the gate current therein and the driving of the GCS is deleteriously affected.

SUMMARY OF THE INVENTION

Accordingly, it is an object of the invention to provide an improved switching circuit using a gate controlled switching device or thyristor of the gate turn-off type as a switching element therein.

Another object is to provide a switching circuit using a gate controlled switching device and in which the conductivity of the latter is reliably controlled by a low level switching control signal.

A further object is to provide a switching circuit using a gate controlled switching device, as aforesaid, which includes an improved gate current applying circuit for effectively controlling the conductivity of the gate controlled switching device.

Still a further object of this invention is to provide a switching circuit using a gate controlled switching device controlled by an improved gate current applying circuit, as aforesaid, and which is suitable for use in a solid-state horizontal deflection output circuit of a television receiver.

In accordance with an aspect of this invention, the gate of the GCS employed as the primary switching element is connected to a diode having its polarity arranged to conduct a current flowing thereto from the gate which is also connected to one end of an inductive element for storing energy when such current flows, and the conductivity of the diode is controlled in response to a control signal so that a turn-off gate current for the GCS flows through the diode when the latter is conductive and a turn-on gate current is supplied to the GCS from the inductive element when the diode is nonconductive by reason of the energy previously stored in the inductive element.

The above, and other objects, features and advantages of the invention, will be apparent from the following detailed description of preferred embodiments of the invention which is to be read in connection with the accompanying drawings.

DESCRIPTION OF THE PREFERRED EMBODIMENTS

Figure 1:
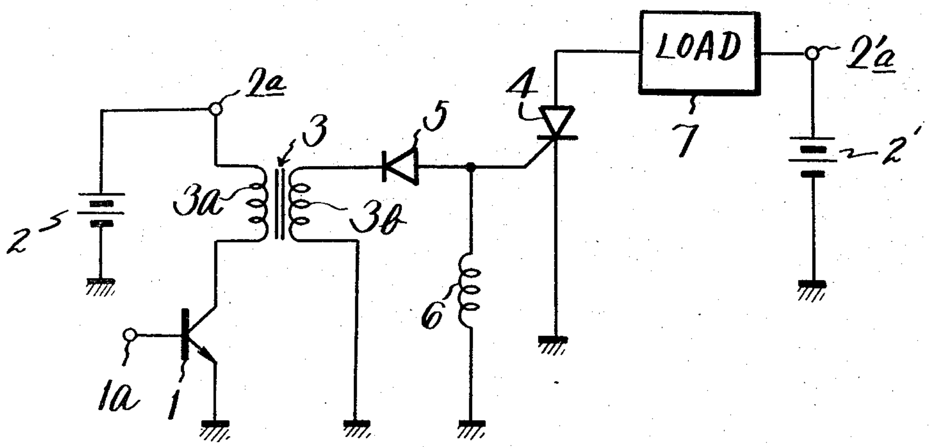
FIG. 1 is a schematic circuit of one embodiment of a switching circuit according to the present invention.

Referring to the drawings in detail, and initially to FIG. 1 thereof, it will be seen that the switching circuit according to this invention, as there illustrated, comprises a driving transistor 1 supplied with a control signal $Va$ (FIG. 3A) at its base electrode by way of a terminal **1*a* connected thereto. The emitter electrode of driving transistor 1 is grounded, while its collector electrode is connected through a primary winding 3*a* of a drive transformer 3 to a terminal 2*a* to which a DC operation voltage is applied from a DC power source 2. A gate controlled switching device 4 (which will be hereinbelow referred to as a GCS) has its gate connected to the anode of a diode 5 and the cathode of such diode is connected to a secondary winding 3*b* of drive transformer 3. Thus, diode 5 has its polarity arranged to conduct a current flowing thereto from the gate of GCS 4. An inductive element 6, such as, an inductor, is connected between ground and a connection point between the anode of diode 5 and the gate of GCS 4. The anode of GCS 4 is connected through a load 7 to a terminal 2'***a* which is supplied with a DC operation voltage from a DC power source 2'. The cathode of the GCS 4 is shown to be grounded directly in the embodiment of FIG. 1, but it may be grounded through a suitable impedance element.

The operation of the switching circuit shown in FIG. 1 will be now described with reference to FIGS. 3A to 3G.

The base electrode of driving transistor 1 is supplied through terminal 1*a* with a pulse voltage V*a* (FIG. 3A) constituting the control signal, so that driving transistor 1 is turned-on during a time interval $t_1$ and turned-off during a time interval $t_2$. Accordingly, the collector potential Vb of driving transistor 1 is varied, as shown in FIG. 3B, and hence a voltage VC (FIG. 3C) is induced in the secondary winding 3*b* of the drive transformer 3.

Figures 3A, 3B, 3C, 3D, 3E, 3F, 3G:
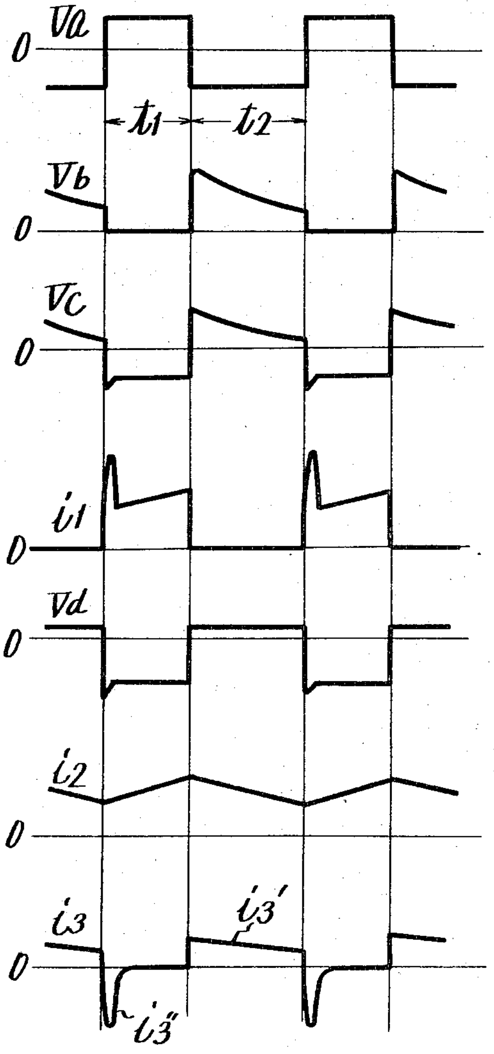
FIGS. 3A to 3G, inclusive, are waveform diagrams to which reference will be made in explaining the operation of the switching circuit shown in FIG. 1.

During the time interval $t_1$, when driving transistor 1 is made conductive, the negative pulse voltage is produced in the secondary winding 3*b* of drive transformer 3, as shown in FIG. 3C, and, therefore, diode 5 is made conductive and the gate potential Vd of GCS 4 becomes negative, as shown in FIG. 3E. As a result, a current $i_1$ (FIG. 3D) flows through diode 5 in the direction from its anode to its cathode. A part of the current $i_1$ is by-passed to inductor 6 and, hence, a current $i_2$ (FIG. 3F) flows through inductor 6 with the result that energy is stored in the latter. Further, a part of the current $i_1$ flows from the cathode of GCS 4 to its gate, which current becomes a negative current component $i''_3$ of a gate current $i_3$ of GCS 4, as shown in FIG. 3G. Thus, GCS 4 is turned-OFF by the negative current component $i''_3$.

Since a positive pulse voltage is induced in secondary winding 3*b* of drive transformer 3 during the time interval $t_2$ within which driving transistor 1 is nonconductive, diode 5 is made nonconductive and hence, the gate potential Vd of GCS 4 is lowered to about zero during that time interval $t_2$, as shown in FIG. 3E. In this state, the energy primarily stored in inductor 6 by the current $i_2$ during time interval $t_1$ becomes a current source and, hence, a current of gradually decreasing amplitude, shown in FIG. 3F, flows through the current path from the gate of GCS 4 to its cathode. Thus, a positive current component $i'_3$ of gate current $i_3$ of GCS 4 is produced (FIG. 3G) which positive current component $i'_3$ flows from the gate of GCS 4 to its cathode to turn-ON GCS 4.

Thus, when the pulse voltage Va shown in FIG. 3A is supplied to terminal 1*a*, GCS 4 is turned-On and -OFF repeatedly, as described above, to apply a switched current to load 7 from source 2'.

With the switching circuit of this invention as described above, even if only a small current flows through the driving stage including DC voltage source 2, driving transistor 1 and drive transformer 3, GCS 4 is positively controlled to its ON and OFF states, so that the switching circuit according to this invention has improved efficiency and substantially reduces the power consumption.

Figure 2:
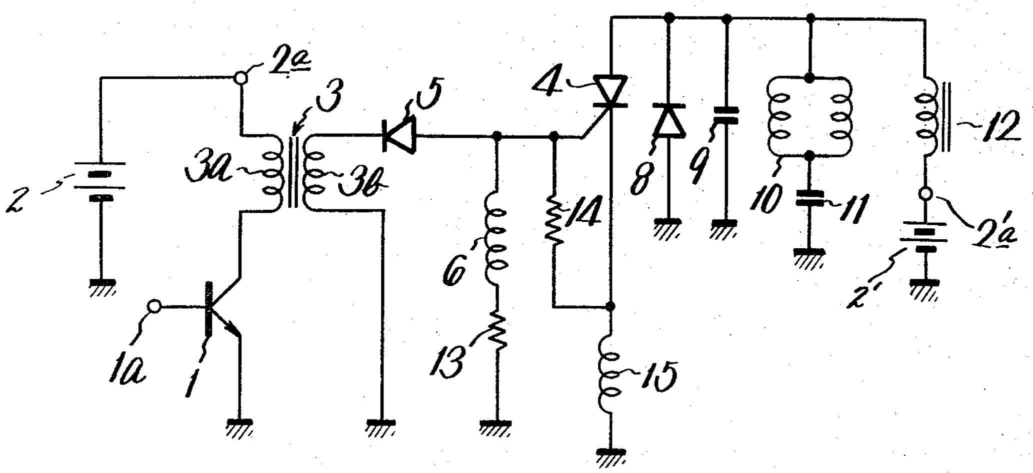
FIG. 2 is a schematic circuit diagram of a horizontal deflection output circuit employing a switching circuit according to the present invention which is generally similar to that shown in FIG. 1.

Switching circuits according to this invention are particularly suited for use in the horizontal deflection output circuits of television receivers, for example, as shown in FIG. 2 in which the components of the illustrated circuit corresponding to those described above with reference to FIG. 1 are identified by the same reference mumerals. Thus, the switching circuit of FIG. 2 is shown to include a driving transistor 1, DC power source 2, drive transformer 3, GCS 4, diode 5 and inductor 6 which are interconnected in the manner previously described. Further, in the circuit of FIG. 2, the anode of GCS 4 is connected with a parallel circuit arrangement of a damper diode 8, a resonance capacitor 9 and a horizontal deflection coil 10 to which a deflection current waveform shaping capacitor 11 is connected in series. The anode of the GCS 4 is further connected, through an output coil 12, forming an inductive load, with terminal 2'*a* to which a DC operating voltage is applied from DC power source 2'. A current limiting resistor 13 is connected in series to inductor 6 which is connected to the gate of GCS 4 and a resistor 14 is connected between the gate and cathode of GCS 4 for avoiding the mixing of an external noise into the gate of GCS 4. The circuit of FIG. 2 is completed by an inductor 15 through which the cathode of GCS 4 is connected to ground for noise elimination.

With the horizontal deflection circuit employing the switching circuit according to this invention, as shown in FIG. 2, the terminal 1*a* connected to the base electrode of driving transistor 1 receives, for example, a horizontal oscillator (not shown), a pulse signal which has a line frequency and a waveform similar to that shown in FIG. 3A. In response to the pulse signal applied to terminal 1*a*, GCS 4 is turned ON and OFF repeatedly, as described in connection with FIG. 1, and as a result of such switching operation of GCS 4, a sawtooth waveform current of the line frequency flows through the horizontal deflection coil 10, as in a conventional horizontal deflection circuit.

The resistor 14 between the gate and cathode of GCS 4 serves to bypass the external noise which may be applied to the gate of the GCS 4 during the time interval when GCS 4 is in the OFF state. Thus, such external noise cannot inadvertently turn ON GCS 4 during the time interval when GCS 4 should be turned OFF, and the resistor 14 ensures that GCS 4 will be operated positively and accurately in accordance with the control signal applied to terminal 1*a*.

Having described specific embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A switching circuit, comprising a gate controlled switching device having an anode connected to one side of a voltage source through a load, a cathode connected to the other side of the voltage source and a gate for controlling the passage of a current from said anode to said cathode in dependence on a gate current flowing between said gate and cathode, a diode connected directly to said gate so as to define a junction thereat, said diode having its polarity arranged to conduct a gate current in the direction from the cathode to the gate of said gate controlled switching device, a coil connected between the junction defined between said gate and said diode and said other side of the voltage source, and means for supplying bias voltages to said diode to selectively control the conductivity of said diode in response to a control signal so that, when said diode conducts, said gate controlled switching device receives a turn-off gate current flowing from said cathode to said gate and through said diode and a current is made to flow in said coil so that the latter then stores energy and, when said diode is reverse biased so as to be non-conductive, the energy previously stored in said coil supplies a turn-on gate current flowing from said gate to said cathode of the gate controlled switching element.

2. A switching circuit in accordance with claim 1, wherein said means for supplying bias voltages to the diode includes a transformer having primary and secondary windings, said secondary winding being connected at one end to said diode and at its other end to said other side of the voltage source, and said primary winding is supplied with a drive signal in response to said control signal.

3. A switching circuit in accordance with claim 2; further comprising a resistor connected between the gate and cathode of said gate controlled switching device.

4. A switching circuit in accordance with claim 1; further comprising a resistor connected between the gate and cathode of said gate controlled switching device.

5. A switching circuit in accordance with claim 1; further comprising a resistor connected in series with said coil.

6. A switching device in accordance with claim 1 wherein the load connected to the anode of the gate controlled switching device comprises a deflection coil coupled to a resonance capacitor; a damper diode connected in parallel relationship with said resonance capacitor; and a source of operating voltage coupled to said deflection coil such that a saw tooth waveform current having a frequency equal to that of said control signal flows through said deflection coil in response to the turning on and turning off of the gate controlled switching device.

* * * * *